United States Patent [19]

Reiter

[11] 4,019,873
[45] Apr. 26, 1977

[54] COATED HARD METAL BODY
[75] Inventor: Norbert Reiter, Mettmann, Germany
[73] Assignee: Fried. Krupp Gesellschaft mit beschränkter Haftung, Essen, Germany
[22] Filed: June 3, 1976
[21] Appl. No.: 692,304
[30] Foreign Application Priority Data
June 6, 1975 Germany .......................... 2525185
[52] U.S. Cl. .............................. 428/217; 51/207; 51/309 R; 51/309 A; 428/336; 428/539; 428/220; 428/457
[51] Int. Cl.² ...................... C22C 29/00; B22F 7/02
[58] Field of Search ........... 29/182.2, 182.5, 182.7, 29/182.8; 428/336, 539, 328; 51/309, 207

[56] References Cited
UNITED STATES PATENTS

| | | | |
|---|---|---|---|
| 3,647,576 | 3/1972 | Yamamura et al. | 75/202 |
| 3,837,896 | 9/1974 | Lindstrom et al. | 428/336 |
| 3,967,035 | 6/1976 | Hale | 428/336 |

FOREIGN PATENTS OR APPLICATIONS
257,984 11/1969 U.S.S.R.

*Primary Examiner*—Brooks H. Hunt
*Attorney, Agent, or Firm*—Spencer & Kaye

[57] ABSTRACT

A wear-resistant shaped body comprises a core of a hard metal body and a surface coating on the core, with the hard metal body core containing at least one carbide suitable as a hard material and at least one binder metal. The surface coating is composed of two superimposed layers including an outer, extremely wear-resistant layer consisting essentially of aluminum oxide and/or zirconium oxide. The inner layer is composed of at least one boride selected from the group consisting of borides of the elements titanium, zirconium, hafnium, vanadium, niobium, tantalum, chromium, molybdenum and tungsten.

8 Claims, No Drawings

COATED HARD METAL BODY

BACKGROUND OF THE INVENTION

The present invention relates to a wear-resistant shaped hard metal body, and more particularly, to a hard metal body composed of a hard metal body core or substrate which contains a surface coating.

It has long been known that hard metal bodies can be formed from at least one binder or bonding metal of iron, cobalt and nickel and at least one hard metal refractory carbide of at least one of the elements titanium, zirconium, hafnium, vanadium, niobium, tantalum, chromium, molybdenum and tungsten. The hard metal body generally is formed by uniting a powdered form of the hard metal carbide by compression with the binding metal, followed by sintering. During the sintering process, the product generally receives its final shape and dimensions and the resulting sintered product is a molded, shaped, hard metal body which often is referred to as a cemented carbide. The hard metal bodies process great hardness and find wide application in metal turning and cutting tools which are hard enough to permit high turning and cutting speeds in rock or metal.

Increasing demands have been placed on hard metal bodies and there has been a continuing search to provide hard metal bodies having still greater wear resistance. To this end, there has been produced hard metal bodies comprising a core of a shaped, hard metal body formed from a hard metal carbide and bonding metal as described above and a surface coating of a hard material on the core. The surface coating of hard material has been made from such materials as carbides, nitrides, borides and/or oxides, and generally is formed by deposition on the core of the hard metal body during a separate process step. For example, deposition from the gaseous phase according to the chemical vapor deposition (CVD) process is a preferred method for forming a surface coating on a hard metal body. Among the oxides which have been used for forming surface coatings, aluminum oxide and zirconium oxide have been found to be particularly useful as wear-resistant surfaces on the hard metal body core.

In addition to providing an outer layer of a surface coating of hard material on the core of the hard metal body, an inner or intermediate layer has been provided between the core and the outer layer of the surface coating. The main purpose of the inner layer is the equalization of stresses. Metals, such as cobalt, nickel and iron, have proved particularly suitable for this, also precious metals, such as platinum. The inner layers can be applied to the hard metal body by electrodeposition. Inner layers can also be formed by the CVD process or one of the PVD processes.

In one prior art hard metal body containing a surface coating, the hard metal body core contains at least one carbide suitable as a hard material and at least one binder metal and the surface coating is composed of two superimposed layers of which the outer, extremely wear-resistant layer consists of at least one material selected from the group consisting of aluminum oxide and zirconium oxide. In German Offenlegungsschrift No. 2,253,745, published on May 17th, 1973, there is disclosed such a shaped body whose inner layer is composed of one or a plurality of carbides and/or nitrides of the elements titanium, zirconium, hafnium, vanadium, niobium, tantalum, chromium, molybdenum, tungsten, silicon and boron. These known shaped bodies, however, have the drawback that their outer layer often does not have sufficient adhesion. The problem of suitable adhesion of a surface coating to a core of a hard metal body is especially of concern in tools used for turning and cutting operations because the tools are subjected during this use to high impact stresses and strong alternating thermal stresses which often cause the surface coating to chip off which leads to premature failure of the tools.

SUMMARY OF THE INVENTION

It is a primary object of the present invention to provide a hard metal body comprising a core of a hard metal body and a surface coating of a hard material on the core in which the surface coating has improved adhesion to the hard metal body core compared to known hard metal bodies having hard surface coatings.

It is a further object of the present invention to provide a hard metal body having a surface coating comprised of two superimposed layers wherein the adhesion of an extremely wear-resistant outer layer is significantly improved by the application of a suitable inner layer onto a core of a hard metal body and thus to increase the lifetime of tools and other shaped parts which are produced from the hard metal body of the present invention.

Additional objects and advantages of the present invention will be set forth in part in the description which follows and in part will be obvious from the description or can be learned by practice of the invention. The objects and advantages are achieved by means of the compositions, methods, instrumentalities and combinations particularly pointed out in the appended claims.

To achieve the foregoing objects and in accordance with its purpose, the present invention, as embodied and broadly described, provides a wear-resistant shaped body comprising (1) a core of hard metal body containing at least one carbide as a hard material and at least one binder metal and (2) a surface coating on the core, the surface coating being composed of two superimposed layers including an outer, extremely wear-resistant layer consisting essentially of at least one material selected from the group consisting of aluminum oxide and zirconium oxide and an inner layer of at least one boride, selected from the group consisting of the borides of the elements titanium, zirconium, hafnium, vanadium, niobium, tantalum, chromium, molybdenum and tungsten.

The boride used in the inner layer preferably is at least one diboride selected from the group consisting of the diborides of the elements titanium, zirconium, hafnium, vanadium, niobium, tantalum, chromium, molybdenum and tungsten.

The shaped bodies according to the present invention have particularly advantageous properties if their inner layer has a thickness of 0.5 to $20\mu$, preferably 1 to $3\mu$, and if their outer layer has a thickness of 0.5 to $20\mu$, preferably 2 to $10\mu$.

DETAILED DESCRIPTION OF THE INVENTION

The shaped, hard metal body of the present invention contains a core of a hard metal body. The hard metal body core contains at least one carbide suitable as a hard material and at least one binder metal. The term "carbide" as used in the present application generally refers to a carbide of the type normally used in preparing high-strength cutting materials and includes one or more of the metal carbides of tungsten, titanium, tantalum, niobium, vanadium, zirconium, hafnium and molybdenum. The binder metal used in the core generally is at least one metal selected from the group iron, cobalt and nickel. The relative proportions of carbide and binder metal depend on the end use of the product, and generally, the binder metal can comprise from about 5 to about 20% of the core for hard metal bodies intended for use as cutting tools. As will be apparent, other proportions can be used. A typical cemented carbide core contains tungsten carbide as the metal carbide and cobalt as the binder metal.

In the practice of the present invention, a boride layer is formed on the core of the hard metal body and then an outer layer of aluminum oxide and/or zirconium oxide is formed on the boride layer. When the outer layer contains both aluminum oxide and zirconium oxide, any weight ratio of these two oxides to each other can be used.

The shaped bodies according to the present invention are produced according to known coating processes where the deposition of the boride and oxide layers from the gaseous phase on the hard metal body is particularly advantageous. The inner boride layer generally contains at least one or more borides as the sole component of the inner layer and includes borides such as titanium boride ($TiB_2$), zirconium boride ($ZrB_2$), hafnium boride ($HfB_2$), vanadium boride ($VB_2$), niobium boride ($NbB_6$, $NbB$, $NbB_2$), tantalum boride ($TaB$, $TaB_2$), chromium boride ($CrB$, $CrB_2$, $Cr_5B_3$), molybdenum boride ($MoB$, $MoB_2$) and tungsten boride ($WB$, $W_2B_5$ and $W_2B$). Because of the carbon content of the hard metal core there can be a small amount of carbide of the deposited refractory element in the inner boride layer.

The shaped bodies structured according to the present invention have the following advantages compared to known layered hard metal bodies. First, the outer layer his very high adhesion because the inner boride layer almost completely prevents diffusion of carbon from the hard metal body core even at high temperatures. Second, the shaped hard metal body of the present invention does not exhibit formation of brittling eta layers between the boride layer and the core of the hard metal body. In addition, the shaped bodies according to the present invention exhibit substantially improved wear behavior with a smooth cut as well as with an interrupted cut.

The consistency, production and characteristics of the objects made according to the present invention will now be explained in detail with the aid of an example. The following example is given by way of illustation to further explain the principles of the invention. This example is merely illustrative and is not to be understood as limiting the scope and underlying principles of the invention in any way. All percentages referred to herein are by weight unless otherwise indicated.

EXAMPLE

An already formed and shaped hard metal body, consisting of 80% tungsten monocarbide, 13% titanium carbide and tantalum carbide and 7% cobalt is used as a core and is treated in a first reaction stage at 1000° C, under a pressure of 50 Torr, for 1 hour, with a gas mixture composed of boron trichloride, titanium tetrachloride and hydrogen. The hard metal body is brought to the reaction temperature of 1000° C by heating it in a protective gas atmosphere. During the subsequent 1-hour treatment with the gas mixture, a $TiB_2$ layer of $3\mu$ thickness is produced. In order to apply the $TiB_2$ layer, a gas mixture of the following composition is used: 1900 l hydrogen per hour, 20 ml $TiCl_4$ per hour, and 4 g $BCl_3$ per hour.

In a second reaction stage, the hard metal body, which has been coated with $TiB_2$, is treated for 3 hours, at 1100° C and atmospheric pressure, with a gas mixture consisting of aluminum trichloride, carbon dioxide and/or carbon monoxide, and hydrogen. In the second reaction stage, an $\alpha$-aluminum oxide layer of about $5\mu$ thickness is deposited on the hard metal body. The gas mixture used in the second reaction stage is produced by conducting hydrogen over aluminum trichloride which has been heated to 130° C, and then $CO_2$ or CO, respectively, is added to this mixture. In, the second reaction stage, a gas mixture with the following composition is used, for example: 500 l hydrogen per hour, 5 l carbon dioxide per hour, and 20 g aluminum trichloride per hour.

The two reaction stages may be conducted in one furnace or in two separate furnaces.

The hard metal body composed according to the present invention, when compared with hard metal bodies coated according to known processes and with hard metal bodies without coatings, exhibits improved characteristics. The properties of a reversible cutting disc produced of the hard metal body according to the present invention and used in the cutting of steel and cast materials are measured by means of a cutting experiment and compared with the properties of a known cutting disc made of a hard metal body provided with a known coating and a cutting disc comprised of an uncoated hard metal body.

In the cutting experiment, a C 53 N steel was cut with the reversible cutting disc under the following conditions:

| | | | |
|---|---|---|---|
| Rake angle $\gamma$ | = | −6° | |
| Back rake angle $\lambda$ | = | −6° | |
| Clearance angle $\alpha$ | = | −6° | |
| Corner radius r | = | 0.8 | mm |
| Lead angle X | = | 60° | |
| Cutting speed "v" | = | 224 | m/min |
| Cutting depth "a" | = | 2 | mm |
| Advance "s" | = | 0.22 | mm/revolution |
| Cutting time "T" | = | 5 | min |

The results of the cutting experiment with respect to wear characteristics are shown below.

| | Depth of Crater Wear KT ($\mu$) | Width of Flank Wear VB (mm) |
|---|---|---|
| Reversible cutting disc of a hard metal body according to the present invention | 4 | 0.06 |
| Reversible cutting disc made of a hard metal body provided with a known coating | 15 | 0.12 |
| Reversible cutting disc of an uncoated hard metal body | 175 | 0.43 |

As can be seen from the above table, the reversible cutting plate made according to the present invention has substantially better characteristics than the other cutting plates.

It will be understood that the above description of the present invention is susceptible to various modifications, changes and adaptations, and the same are intended to be comprehended within the meaning and range of equivalents of the appended claims.

What is claimed is:

1. A wear-resistant shaped body comprised of (1) a core of hard metal body of at least one carbide as hard material and at least one binder metal and (2) a surface coating on the core, said surface coating being composed of two superimposed layers including an outer, extremely wear-resistant layer consisting essentially of at least one material selected from the group consisting of aluminum oxide and zirconium oxide, and an inner layer of at least one boride selected from the group consisting of the borides of the elements titanium, zirconium, hafnium, vanadium, niobium, tantalum, chromium, molybdenum and tungsten.

2. A shaped body as defined in claim 1 wherein the inner layer has a thickness of 0.5 to 20$\mu$.

3. A shaped body as defined in claim 1 wherein the inner layer has a thickness of 1 to 3$\mu$.

4. A shaped body as defined in claim 1 wherein the outer layer has a thickness of 0.5 to 20$\mu$.

5. A shaped body as defined in claim 1 wherein the outer layer has a thickness of 2 to 10$\mu$.

6. A shaped body as defined in claim 1 wherein the inner layer has a thickness of 0.5 to 20$\mu$ and the outer layer has a thickness of 0.5 to 20$\mu$.

7. A shaped body as defined in claim 1 wherein the inner layer is composed of at least one diboride selected from the group consisting of the diborides of the elements titanium, zirconium, hafnium, vanadium, niobium, tantalum, chromium, molybdenum and tungsten.

8. A shaped body as defined in claim 1 wherein the hard metal body core contains at least one carbide selected from the group consisting of the carbides of the metals titanium, tantalum, niobium, vanadium, zirconium, hafnium and molybdenum.

* * * * *